(12) United States Patent
Kim et al.

(10) Patent No.: US 10,206,299 B2
(45) Date of Patent: Feb. 12, 2019

(54) ELECTRIC CONNECTION DEVICE AND ELECTRONIC DEVICE HAVING THE SAME

(71) Applicant: Samsung Electronics Co., Ltd, Gyeonggi-do (KR)

(72) Inventors: Eungwon Kim, Gyeonggi-do (KR); Wangik Son, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/374,806

(22) Filed: Dec. 9, 2016

(65) Prior Publication Data

US 2017/0172005 A1 Jun. 15, 2017

(30) Foreign Application Priority Data

Dec. 10, 2015 (KR) ........................ 10-2015-0176048

(51) Int. Cl.
| | |
|---|---|
| H05K 5/04 | (2006.01) |
| H05K 5/00 | (2006.01) |
| H05K 7/14 | (2006.01) |
| H04M 1/02 | (2006.01) |
| G06F 1/16 | (2006.01) |
| H01R 4/64 | (2006.01) |

(52) U.S. Cl.
CPC ............ *H05K 5/04* (2013.01); *G06F 1/1658* (2013.01); *G06F 1/1698* (2013.01); *H01R 4/646* (2013.01); *H04M 1/026* (2013.01); *H05K 5/0017* (2013.01); *H05K 7/1427* (2013.01)

(58) Field of Classification Search
CPC ..... G06F 1/1658; G06F 1/1698; H01R 4/646; H04M 1/026; H05K 5/04
USPC ......................................................... 361/752
See application file for complete search history.

(56) References Cited

U.S. PATENT DOCUMENTS

| 9,866,738 B2* | 1/2018 | Kojima | ................ H04N 5/2257 |
| 2010/0025096 A1* | 2/2010 | Nikaido | ................. H01R 12/57 |
| | | | 174/260 |

FOREIGN PATENT DOCUMENTS

KR 101449613 B1 10/2014

* cited by examiner

*Primary Examiner* — Tremesha S Willis

(57) ABSTRACT

According to various embodiments, an electronic device includes a first electronic component, a second electronic component electrically connected to the first electronic component, and a conductive electric connection device disposed to electrically connect the second component and the first electronic component to each other. The electric connection device may include a first member fixed to the first electronic component, a second member formed to extend upward from the first member, and a third member formed to extend from the second member to be substantially parallel to a direction of overlapping with the first member. The second electronic component may be interposed in a space between the first member and the second member to be electrically connected to at least two areas of the second electronic component. Various other embodiments may be made.

19 Claims, 10 Drawing Sheets

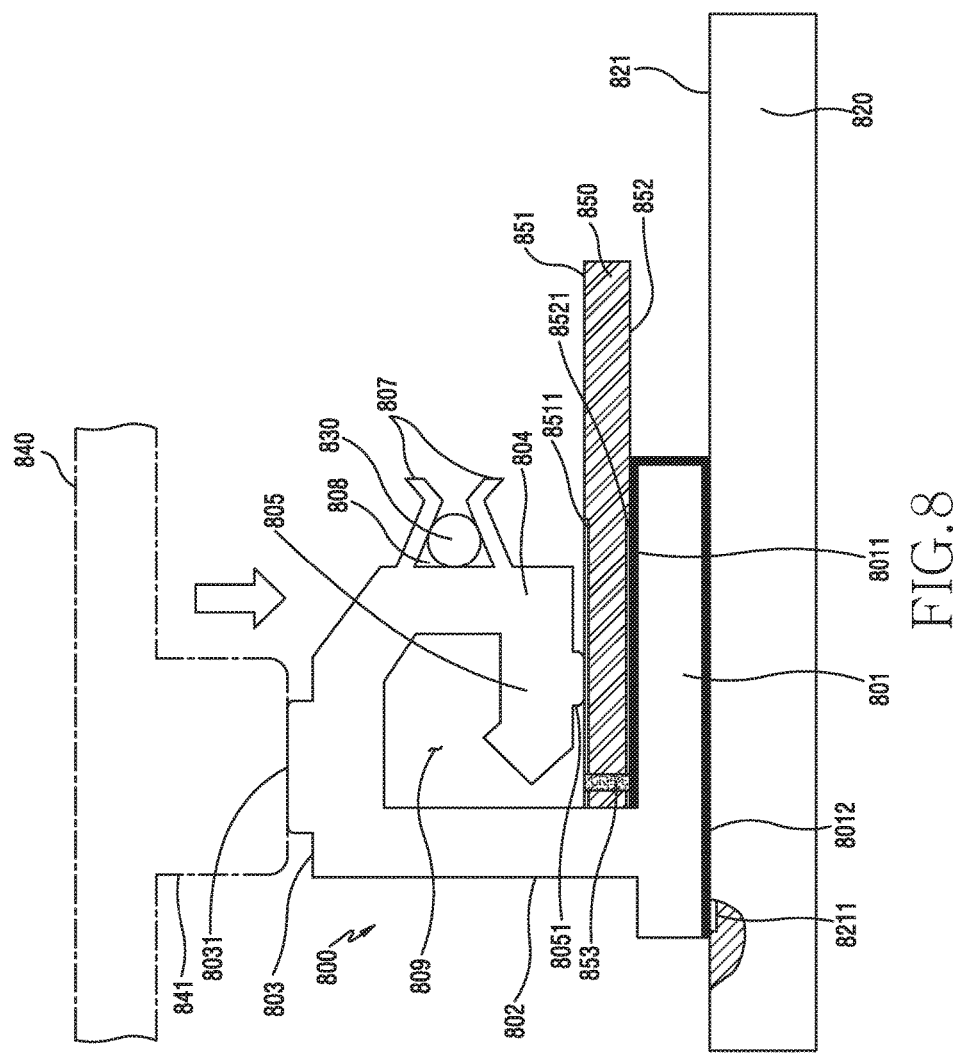

ELECTRIC CONNECTION DEVICE AND ELECTRONIC DEVICE HAVING THE SAME

CROSS-REFERENCE TO RELATED APPLICATION(S) AND CLAIM OF PRIORITY

The present application is related to and claims priority under 35 U.S.C. § 119(a) to Korean Application Serial No. 10-2015-0176048, which was filed in the Korean Intellectual Property Office on Dec. 10, 2015, the entire content of which is hereby incorporated by reference.

TECHNICAL FIELD

Various embodiments of the present disclosure relate to an electric connection device. For example, various embodiments of the present disclosure relate to an electronic device that includes an electric connection device.

BACKGROUND

An electronic device may have a configuration in which individual electronic components are electrically connected to each other in order to conduct various functions. According to one embodiment, a first electronic component and a second electronic component may be electrically connected to each other in such a manner that the second electronic component is fixed to the first electronic component. According to one embodiment, the first electronic component and the second electronic component may be electrically connected to each other via an electric connection device. According to one embodiment, such an electric connection device may be formed of a conductive material.

The electric connection device may have a configuration in which the electric connection device is fixed to at least one of the first and second electronic components, and comes in selective contact with the remaining one of the first and second electronic components. For example, the electric connection device may be assembled in a state where the first electronic component and the second electronic component are separated from each other in the manufacturing process.

SUMMARY

In general, a separate electric connection member may be used in order to electrically connect two electronic components that are spaced apart from each other in an electronic device.

According to one embodiment, the electric connection member may include a finger-type clip (e.g., a C-clip) or a conductive tape, and may be fixed to one electronic component to be physically connected to the remaining one of the electronic components. For example, the electric connection member may be used to electrically connect a metallic member around a board to a ground portion of the board. However, the above-mentioned electric connection member may not have good electrical contact and a resistance value because a sufficient contact area is not secured, or may suffer from a progressive reduction in contact force as a result of an external shock and a peripheral environment condition. According to one embodiment, when an antenna suffers from a reduction in the contact force of an electric connection member, RF noise may be induced and degradation in radiation performance may be caused.

According to various embodiments, it is possible to provide an electric connection device and an electronic device including the same.

According to various embodiments, it is possible to provide an electric connection device configured to have a stable contact so as to secure excellent performance regardless of an external shock and a peripheral environment condition, and to provide an electronic device including the electric connection device.

According to various embodiments, there may be provided an electronic device including: a first electronic component; a second electronic component electrically connected to the first electronic component; and a conductive electric connection device disposed to electrically connect the second component and the first electronic component to each other. The electric connection device may include: a first member fixed to the first electronic component; a second member formed to extend upward from the first member; and a third member formed to extend from the second member to be substantially parallel to a direction of overlapping with the first member. The second electronic component may be interposed in a space between the first member and the second member to be electrically connected to at least two areas of the second electronic component.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 8 illustrates a sectional view of a principal portion of an electronic device in a state in which two electronic components are electrically connected by an electric connection device according to various embodiments of the present disclosure.

DETAILED DESCRIPTION

Figure 1:
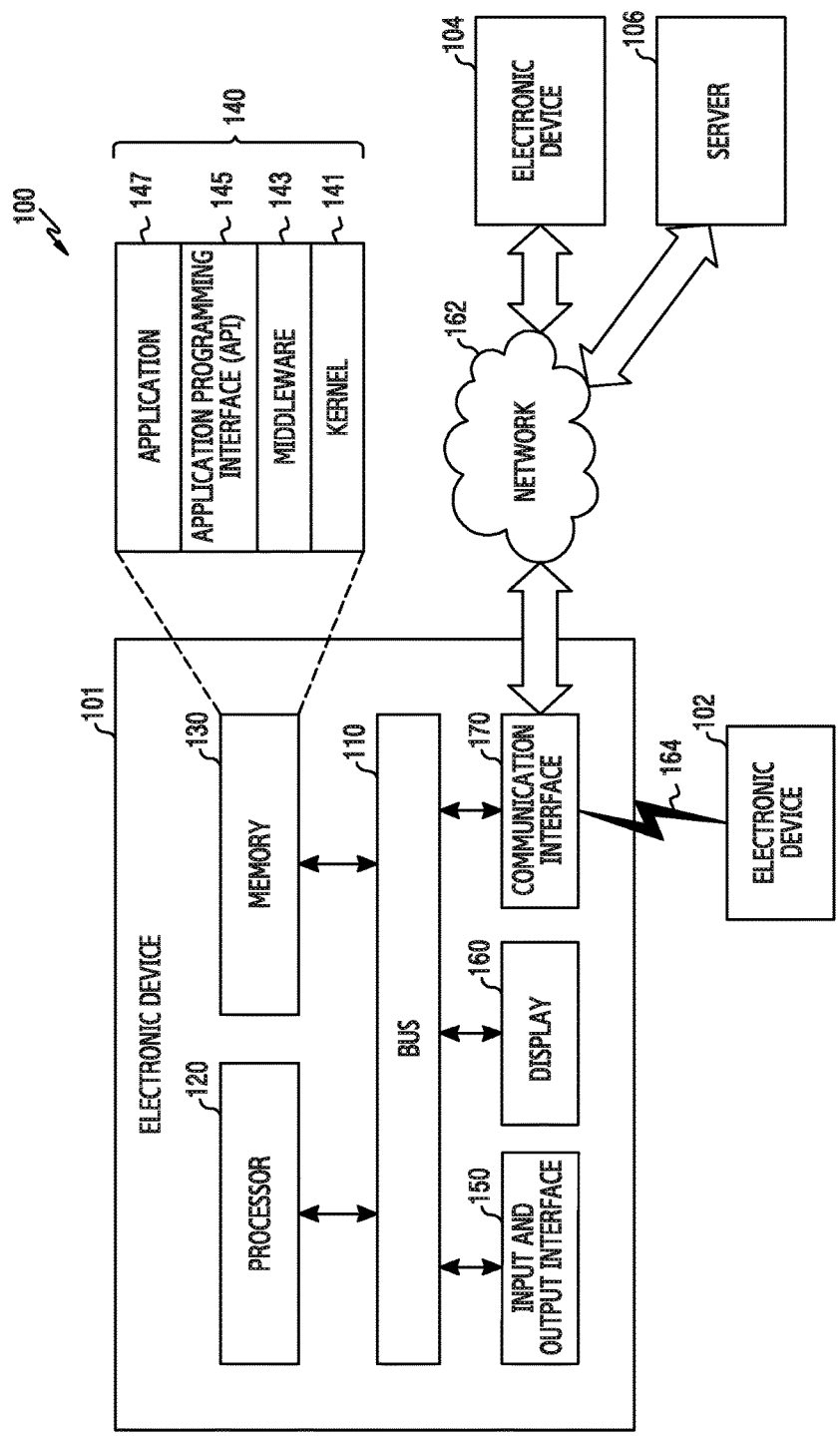
FIG. 1 illustrates a view of a network environment that includes an electronic device according to various embodiments of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged.

The following description with reference to the accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to their dictionary meanings, but are merely used to enable a clear and consistent understanding of the present disclosure. Accordingly, it should be apparent to those skilled in the art that the following description of various embodiments of the present disclosure is provided for illustrative purposes only and not for the purpose of limiting the present disclosure as defined by the appended claims and their equivalents.

It is to be understood that the singular forms "a," "an," and "the" include plural references unless the context clearly dictates otherwise. Thus, for example, reference to "a component surface" includes reference to one or more of such surfaces.

FIGS. 1, 2, 3, 4, 5A, 5B, 6, 7A, 7B, and 8 discussed below, and the various embodiments used to describe the principles of the present disclosure are by way of illustration only and should not be construed in any way to limit the scope of the disclosure. Those skilled in the art will understand that the principles of the present disclosure may be implemented in any suitably arranged electronic device.

The terms "include" and "may include" used herein are intended to indicate the presence of a corresponding function, operation, or constitutional element disclosed herein, and are not intended to limit the presence of one or more functions, operations, or constitutional elements. In addition, the terms "include" and "have" are intended to indicate that characteristics, numbers, operations, constitutional elements, and elements disclosed in the specification or combinations thereof exist. However, additional possibilities of one or more other characteristics, numbers, operations, constitutional elements, elements or combinations thereof may exist.

As used herein, the expression "or" includes any and all combinations of words enumerated together. For example, "A or B" may include either A or B, or may include both A and B.

Although expressions used in various embodiments of the present disclosure, such as "1st", "2nd", "first", "second" may be used to express various constituent elements of the various embodiments of the present disclosure, these expressions are not intended to limit the corresponding constituent elements. The above expressions are not intended to limit an order or an importance of the corresponding constituent elements. The above expressions may be used to distinguish one constituent element from another constituent element. For example, a first user device and the second user device are both user devices, and indicate different user devices. Similarly, a first constituent element may be referred to as a second constituent element, and the second constituent element may be referred to as the first constituent element without departing from the scope of the present disclosure.

When an element is mentioned as being "connected" to or "accessing" another element, this may mean that the element is directly connected to or accessing the other element, or there may be intervening elements present between the two elements. On the other hand, when an element is mentioned as being "directly connected" to or "directly accessing" another element, it is to be understood that there are no intervening elements present.

The term "module" as used herein may imply a unit including one of hardware, software, and firmware, or a combination thereof. The term "module" may be interchangeably used with terms, such as unit, logic, logical block, component, circuit, and the like. A module as described herein may be a minimum unit of an integrally constituted component or may be a part thereof. The module may be a minimum unit for performing one or more functions or may be a part thereof. The module may be mechanically or electrically implemented. For example, the module as described herein includes at least one of an application-specific integrated circuit (ASIC) chip, a field-programmable gate arrays (FPGAs), and a programmable-logic device, which are known or will be developed and which perform certain operations.

By the term "substantially" it is meant that the recited characteristic, parameter, or value need not be achieved exactly, but that deviations or variations, including, but not limited to, for example, tolerances, measurement errors, measurement accuracy limitations and other factors known to persons of ordinary skill in the art, may occur in amounts that do not preclude the effect the characteristic was intended to provide.

Unless otherwise defined, all terms, including technical and scientific terms, used herein have the same meaning as commonly understood by those of ordinary skill in the art to which various embodiments of the present disclosure belong. It will be further understood that terms, such as those defined in commonly used dictionaries, should be interpreted as having meanings that are consistent with their meaning in the context of the relevant art and the various embodiments of the present disclosure, and should not be interpreted in an idealized or overly formal sense unless expressly so defined herein.

An electronic device as used herein may be a device including, but not limited to, an antenna capable of performing a communication function in at least one frequency band. For example, the electronic device may be a smart phone, a tablet personal computer (PC), a mobile phone, a video phone, an e-book reader, a desktop PC, a laptop PC, a netbook computer, a personal digital assistant (PDA), a portable multimedia player (PMP), a moving picture experts group phase 1 or phase 2 (MPEG-1 or MPEG-2) audio layer 3 (MP3) player, a mobile medical device, a camera, and a wearable device (e.g., a head-mounted-device (HIVID), such as electronic glasses, electronic clothes, an electronic bracelet, an electronic necklace, an electronic appcessory, an electronic tattoo, a smart watch, and the like).

The electronic device may be a smart home appliance having an antenna. For example, the smart home appliance may include at least one of a television (TV), a digital versatile disc (DVD) player, an audio player, a refrigerator, an air conditioner, a cleaner, an oven, a microwave oven, a washing machine, an air purifier, a set-top box, a TV box (e.g., Samsung HomeSync®, Apple TV®, or Google TV®), a game console, an electronic dictionary, an electronic key, a camcorder, and an electronic picture frame.

The electronic device including the antenna may be one of various medical devices (e.g., magnetic resonance angiography (MRA), magnetic resonance imaging (MM), computed tomography (CT), imaging equipment, an ultrasonic instrument, and the like), a navigation device, a global positioning system (GPS) receiver, an event data recorder (EDR), a flight data recorder (FDR), a car infotainment device, electronic equipment for a ship (e.g., a vessel navigation device, a gyro compass, and the like), avionics, a security device, a car head unit, an industrial or domestic robot, an automatic teller machine (ATM), a point of sales (POS) device, and the like.

The electronic device may be part of at least one of an item of furniture or a building/structure including an antenna. The electronic device may be an electronic board, an electronic signature input device, a projector, or any of various measurement machines (e.g., water supply, electricity, gas, a propagation measurement machine, and the like).

The electronic device may be one or more combinations of the aforementioned various devices. In addition, the electronic device may be a flexible device. Moreover, the electronic device is not limited to the aforementioned devices.

Hereinafter, an electronic device according to various embodiments of the present disclosure will be described with reference to the accompanying drawings. The term 'user' used in the various embodiments may refer to a person who uses the electronic device or a device which uses the electronic device (e.g., an artificial intelligence (AI) electronic device).

FIG. 1 illustrates a view of a network environment including an electronic device according to an embodiment of the present disclosure.

Referring to FIG. 1, a network environment 100 includes an electronic device 101. The electronic device 101 includes a bus 110, a processor 120, a memory 130, an input/output interface 150, a display 160, and a communication interface 170. In various embodiments of the present disclosure, the electronic device 101 can omit at least one of the components or further include another component.

The bus 110 includes a circuit for connecting the components (e.g., the processor 120, the memory 130, the input/output interface 150, the display 160, and the communication interface 170) and delivering communications (e.g., a control message) therebetween.

The processor 120 includes one or more of a central processing unit (CPU), an application processor (AP), and a communication processor (CP). The processor 120 processes an operation or data on control of and/or communication with another component of the electronic device 101.

The processor 120, which is connected to the long term evolution (LTE) network, determines whether a call is connected over the circuit switched (CS) service network using caller identification information (e.g., a caller phone number) of the CS service network (e.g., the 2nd generation (2G)/3rd generation (3G) network). For example, the processor 120 receives incoming call information (e.g., a CS notification message or a paging request message) of the CS service network over the long term evolution (LTE) network (e.g., circuit-switched fallback (CSFB)). The processor 120 being connected to the LTE network receives incoming call information (e.g., a paging request message) over the CS service network (e.g., single radio LTE (SRLTE)).

When receiving the incoming call information (e.g., a CS notification message or a paging request message) of the CS service network over the LTE network, the processor 120 obtains caller identification information from the incoming call information. The processor 120 displays the caller identification information on the display 160. The processor 120 determines whether to connect the call based on input information corresponding to the caller identification information displayed on the display 160. For example, when detecting input information corresponding to an incoming call rejection, through the input/output interface 150, the processor 120 restricts the voice call connection and maintains the LTE network connection. For example, when detecting input information corresponding to an incoming call acceptance, through the input/output interface 150, the processor 120 connects the voice call by connecting to the CS service network.

When receiving the incoming call information (e.g., a CS notification message or a paging request message) of the CS service network over the LTE network, the processor 120 obtains caller identification information from the incoming call information. The processor 120 determines whether to connect the call by comparing the caller identification information with a reception control list. For example, when the caller identification information is included in a first reception control list (e.g., a blacklist), the processor 120 restricts the voice call connection and maintains the connection to the LTE network. When the caller identification information is not included in the first reception control list (e.g., the blacklist), the processor 120 connects the voice call by connecting to the CS service network. When the caller identification information is included in a second reception control list (e.g., a white list), the processor 120 connects the voice call by connecting to the CS service network.

When receiving the incoming call information (e.g., a paging request message) of the CS service network over the LTE network, the processor 120 sends an incoming call response message (e.g., a paging response message) to the CS service network. The processor 120 suspends the LTE service and receives the caller identification information (e.g., a circuit-switched call (CC) setup message) from the CS service network. The processor 120 determines whether to connect the call by comparing the caller identification information with the reception control list. For example, when the caller identification information is included in the first reception control list (e.g., the blacklist), the processor 120 restricts the voice call connection and resumes the LTE network connection. When the caller identification information is not included in the first reception control list (e.g., the blacklist), the processor 120 connects the voice call by connecting to the CS service network. For example, when the caller identification information is included in the second reception control list (e.g., the white list), the processor 120 connects the voice call by connecting to the CS service network.

The memory 130 can include volatile and/or nonvolatile memory. The memory 130 stores commands or data (e.g., the reception control list) relating to at least another component of the electronic device 101. The memory 130 may store software and/or a program 140. The program 140 may include a kernel 141, middleware 143, an application programming interface (API) 145, and/or application programs (or "applications") 147. At least some of the kernel 141, the middleware 143, and the API 145 may be referred to as an operating system (OS).

The kernel 141 controls or manages system resources (e.g., the bus 110, the processor 120, or the memory 130) used for performing an operation or function implemented by the other programs (e.g., the middleware 143, the API 145, or the applications 147). Furthermore, the kernel 141 provides an interface through which the middleware 143, the API 145, or the applications 147 connects the individual elements of the electronic device 101 to control or manage the system resources.

The middleware 143 functions as an intermediary for allowing the API 145 or the applications 147 to communicate with the kernel 141 to exchange data.

In addition, the middleware 143 processes one or more task requests received from the applications 147 according to priorities thereof. For example, the middleware 143 assigns priorities for using the system resources (e.g., the bus 110, the processor 120, the memory 130, etc.) of the electronic device 101, to at least one of the applications 147. For example, the middleware 143 may perform scheduling or load balancing on the one or more task requests by processing the one or more task requests according to the priorities assigned thereto.

The API 145 is an interface through which the applications 147 control functions provided from the kernel 141 or the middleware 143, and may include at least one interface or function (e.g., an instruction) for file control, window control, image processing, text control, etc.

The input/output interface 150 functions as an interface that transfers instructions or data input from a user or another external device to the other element(s) of the electronic device 101. Furthermore, the input/output interface 150 outputs the instructions or data received from the other element(s) of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, etc. The display 160 displays various types of content (e.g., text, images, videos, icons, symbols, etc.) for the user. The display 160 may include a touch screen and receive, for example, a touch, a gesture, proximity, a hovering input, etc., using an electronic pen or the user's body part. The display 160 may display a web page.

The communication interface 170 can establish a communication between the electronic device 101 and an external electronic device (e.g., a first external electronic device 102, a second external electronic device 104, or a server 106). For example, the communication interface 170 can communicate with the first external electronic device 102, the second external electronic device 104, or the server 106 in connection to the network 162 through wireless communication or wired communication or via a short-range communication 164. For example, the wireless communication can conform to a cellular communication protocol including at least one of LTE, LTE-advanced (LTE-A), code division multiple access (CDMA), wideband CDMA (WCDMA), universal mobile telecommunication system (UMTS), wireless broadband (WiBro), and global system for mobile communications (GSM).

The wired communication can include at least one of universal serial bus (USB), high definition multimedia interface (HDMI), recommended standard 232 (RS-232), and plain old telephone service (POTS).

The network 162 can include at least one telecommunications network, for example, a computer network (e.g., local area network (LAN) or wide area network (WAN)), internet, or a telephone network.

The electronic device 101 provides the LTE service in the single radio environment by use of at least one module functionally or physically separated from the processor 120.

Each of the first and second external electronic devices 102 and 104 may be a type of device that is the same as or different from the electronic device 101. According to an embodiment of the present disclosure, the server 106 may include a group of one or more servers. All or some of the operations to be executed by the electronic device 101 may be executed by another electronic device or a plurality of other electronic devices (e.g., the electronic devices 102 and 104 or the server 106). In the case where the electronic device 101 may perform a certain function or service automatically or by request, the electronic device 101 may request some functions that are associated therewith from the other electronic devices (e.g., the electronic devices 102 and 104 or the server 106) instead of or in addition to executing the function or service by itself. The other electronic devices (e.g., the electronic devices 102 and 104 or the server 106) may execute the requested functions or additional functions, and may transmit the results to the electronic device 101. The electronic device 101 may provide the requested functions or services by processing the received results. For this purpose, for example, a cloud computing technique, a distributed computing technique, or a client-server computing technique may be used.

Figure 2:
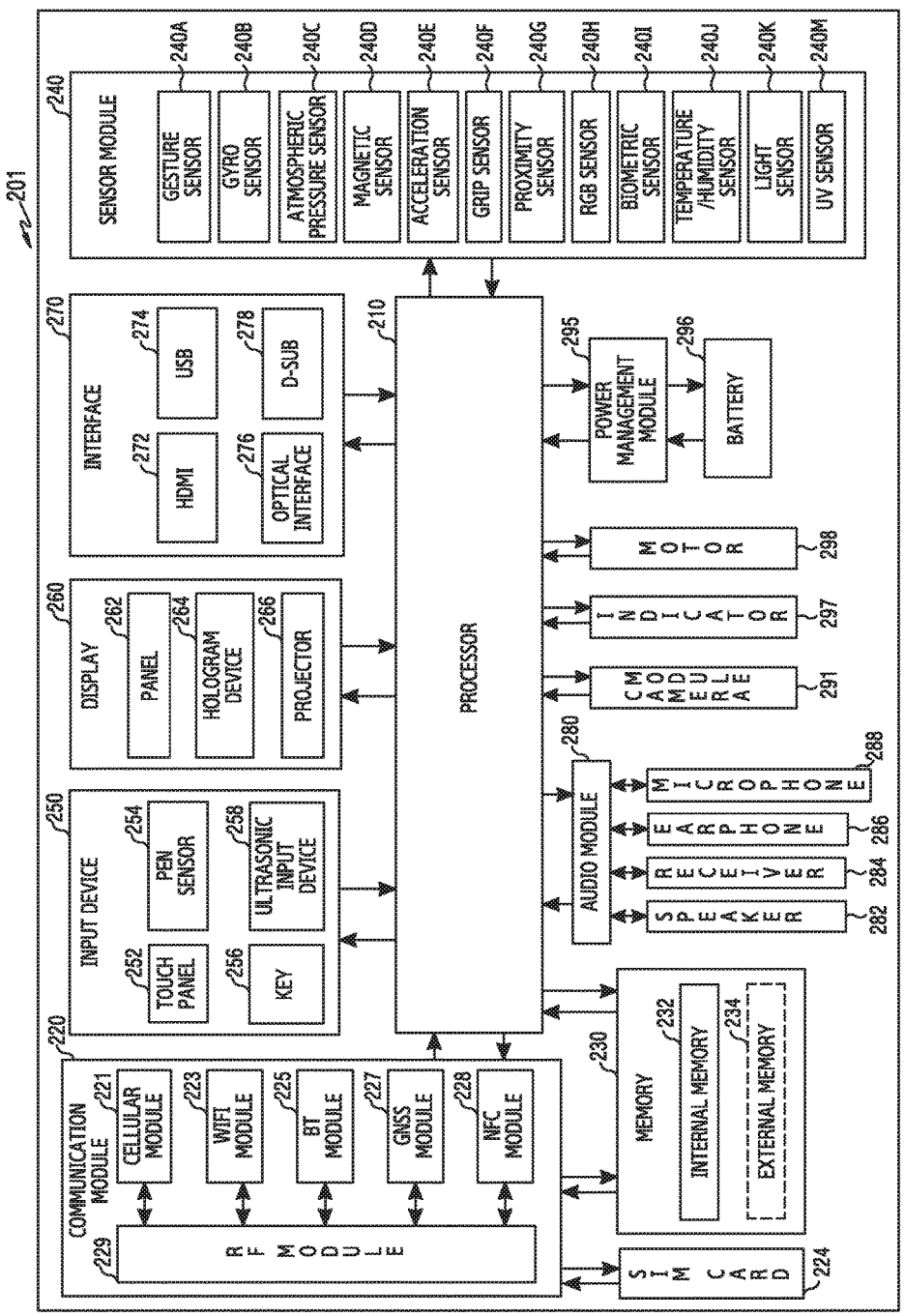
FIG. 2 illustrates a block diagram of an electronic device according to various embodiments of the present disclosure.

FIG. 2 illustrates a block diagram of a configuration of an electronic device according to an embodiment of the present disclosure.

Referring to FIG. 2, a configuration of the electronic device 201 is provided. The electronic device 201 may include all or some of the components described with reference to the electronic device 101 of FIG. 1. The electronic device 201 includes at least one processor 210, a communication module 220, a subscriber identification module (SIM) card 224, a memory 230, a sensor module 240, an input device 250, a display 260, an interface 270, an audio module 280, a camera module 291, a power management module 295, a battery 296, an indicator 297, and a motor 298.

The AP 210 controls a plurality of hardware or software elements connected to the AP 210 by driving an OS or an application program. The AP 210 processes a variety of data, including multimedia data, and performs arithmetic operations. The AP 210 may be implemented, for example, with a system on chip (SoC). The AP 210 may further include a graphical processing unit (GPU).

The communication module 220 performs data transmission/reception in communication between the external electronic device 104 or the server 106 which may be connected with the electronic device 201 through the network 162. The communication module 220 includes a cellular module 221, a Wi-Fi module 223, a BT module 225, a global navigation satellite system (GNSS) or GPS module 227, a near field communication (NFC) module 228, and a radio frequency (RF) module 229.

The cellular module 221 provides a voice call, a video call, a text service, an internet service, and the like, through a communication network (e.g., LTE, LTE-A, CDMA, WCDMA, UMTS, WiBro, and GSM, and the like). In addition, the cellular module 221 identifies and authenticates the electronic device 201 within the communication network by using the SIM card 224. The cellular module 221 may perform at least some of functions that can be provided by the AP 210. For example, the cellular module 221 may perform at least some of multimedia control functions.

The cellular module 221 includes a CP. Further, the cellular module 221 may be implemented, for example, with an SoC. Although elements, such as the cellular module 221 (e.g., the CP), the memory 230, and the power management module 295 are illustrated as separate elements with respect to the AP 210 in FIG. 2, the AP 210 may also be implemented such that at least one part (e.g., the cellular module 221) of the aforementioned elements is included in the AP 210.

The AP 210 or the cellular module 221 loads an instruction or data, which is received from each non-volatile memory connected thereto or at least one of different elements, to a volatile memory and processes the instruction or data. In addition, the AP 210 or the cellular module 221 stores data, which is received from at least one of different elements or generated by at least one of different elements, into the non-volatile memory.

Each of the Wi-Fi module 223, the BT module 225, the GNSS module 227, and the NFC module 228 includes a processor for processing data transmitted/received through a corresponding module. Although the cellular module 221, the Wi-Fi module 223, the BT module 225, the GNSS module 227, and the NFC module 228 are illustrated in FIG. 2 as separate blocks, at least some (e.g., two or more) of the cellular module 221, the Wi-Fi module 223, the BT module 225, the GNSS module 227, and the NFC module 228 may be included in one integrated chip (IC) or IC package. For example, at least some of processors corresponding to the cellular module 221, the Wi-Fi module 223, the BT module 225, the GNSS module 227, and the NFC module 228 (e.g., a communication processor corresponding to the cellular module 221 and a Wi-Fi processor corresponding to the Wi-Fi module 223) may be implemented with an SoC.

The RF module 229 transmits/receives data, such as an RF signal. The RF module 229 may include a transceiver, a power amp module (PAM), a frequency filter, a low noise amplifier (LNA), and the like. In addition, the RF module 229 may further include a component for transmitting/receiving a radio wave on a free space in wireless communication, for example, a conductor, a conducting wire, and the like. Although it is illustrated in FIG. 2 that the cellular module 221, the Wi-Fi module 223, the BT module 225, the GNSS module 227, and the NFC module 228 share one RF module 229, at least one of the cellular module 221, the Wi-Fi module 223, the BT module 225, the GNSS module 227, the NFC module 228 may transmit/receive an RF signal via a separate RF module.

The SIM card 224 may be inserted into a slot formed at a specific location of the electronic device 201. The SIM card 224 includes unique identification information (e.g., an integrated circuit card identifier (ICCID)) or subscriber information (e.g., an international mobile subscriber identity (IMSI)).

The memory 230 includes an internal memory 232 or an external memory 234.

The internal memory 232 may include at least one of a volatile memory (e.g., a dynamic random access memory (DRAM), a static RAM (SRAM), a synchronous dynamic RAM (SDRAM), and the like) or a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, a not or (NOR) flash memory, and the like). The internal memory 232 may be a solid state drive (SSD).

The external memory 234 may include a flash drive, and may further include, for example, compact flash (CF), secure digital (SD), micro-SD, mini-SD, extreme digital (xD), memory stick, and the like. The external memory 234 may be operatively coupled to the electronic device 201 via various interfaces.

The electronic device 201 may further include a storage unit (or a storage medium), such as a hard drive.

The sensor module 240 measures a physical quantity or detects an operation state of the electronic device 201, and converts the measured or detected information into an electric signal. The sensor module 240 includes, for example, at least one of a gesture sensor 240A, a gyro sensor 240B, a barometric pressure sensor or air sensor 240C, a magnetic sensor 240D, an acceleration sensor 240E, a grip sensor 240F, a proximity sensor 240G, a color sensor 240H (e.g., a red, green, blue (RGB) sensor), a biometric sensor 240I, a temperature/humidity sensor 240J, an illumination/illuminance sensor 240K and an ultraviolet (UV) sensor 240M.

Additionally or alternatively, the sensor module 240 may include, for example, an E-node sensor, an electromyography (EMG) sensor, an electroencephalogram (EEG) sensor, an electrocardiogram (ECG) sensor, a fingerprint sensor, and the like.

The sensor module 240 may further include a control circuit for controlling at least one or more sensors included therein.

The input device 250 includes a touch panel 252, a (digital) pen sensor 254, a key 256, or an ultrasonic input unit 258.

The touch panel 252 recognizes a touch input by using at least one of an electrostatic type configuration, a pressure-sensitive type configuration, and an ultrasonic type configuration. The touch panel 252 may further include a control circuit. In the instance where the touch panel is of the electrostatic type, not only is physical contact recognition possible, but proximity recognition is also possible. The touch panel 252 may further include a tactile layer, which provides the user with a tactile reaction.

The (digital) pen sensor 254 may include a recognition sheet which is a part of the touch panel or is separated from the touch panel. The key 256 may include a physical button, an optical key, or a keypad. The ultrasonic input device 258 may detect ultrasonic waves generated by an input tool through the microphone 288, and may confirm data corresponding to the detected ultrasonic waves.

The (digital) pen sensor 254 may be implemented by using the same or similar method of receiving a touch input of the user or by using an additional sheet for recognition.

The key 256 may be a physical button, an optical key, a keypad, or a touch key.

The ultrasonic input unit 258 is a device by which the electronic device 201 detects a reflected sound wave through a microphone 288 and is capable of radio recognition. For example, an ultrasonic signal, which may be generated by using a pen, may be reflected off an object and detected by the microphone 288.

The electronic device 201 may use the communication module 220 to receive a user input from an external device (e.g., a computer or a server) connected thereto.

The display 260 includes a panel 262, a hologram device 264, or a projector 266.

The panel 262 may be an LCD, an active-matrix organic light-emitting diode (AM-OLED), and the like. The panel 262 may be implemented in a flexible, transparent, or wearable manner. The panel 262 may be constructed as one module with the touch panel 252.

The hologram device 264 uses an interference of light and displays a stereoscopic image in the air.

The projector 266 displays an image by projecting a light beam onto a screen. The screen may be located inside or outside the electronic device 201.

The display 260 may further include a control circuit for controlling the panel 262, the hologram device 264, or the projector 266.

The interface 270 may include an HDMI 272, a USB 274, an optical communication interface 276, or a D-subminiature (D-sub) 278. The interface 270 may be included, for example, in the communication interface 160 of FIG. 1. Additionally or alternatively, the interface 270 may include, for example, mobile high-definition link (MHL), SD/multimedia card (MMC) or infrared data association (IrDA).

The audio module 280 bilaterally converts a sound and an electric signal. At least some elements of the audio module 280 may be included in the input/output interface 150 of FIG. 1. The audio module 280 converts sound information which is input or output through a speaker 282, a receiver 284, an earphone 286, the microphone 288, and the like.

The speaker 282 may output a signal of an audible frequency band and a signal of an ultrasonic frequency band. Reflected waves of an ultrasonic signal emitted from the speaker 282 may be received, or a signal of an external audible frequency band may also be received.

The camera module 291 is a device for image and video capturing, and may include one or more image sensors (e.g., a front sensor or a rear sensor), a lens, an image signal processor (ISP), or a flash (e.g., an LED or a xenon lamp). In certain instances, it may prove advantageous to include two or more camera modules.

The power management module 295 manages power of the electronic device 201. The power management module 295 may include a power management integrated circuit (PMIC), a charger IC, or a battery gauge.

The PMIC may be placed inside an IC or SoC semiconductor. Charging is classified into wired charging and wireless charging. The charger IC charges a battery, and prevents an over-voltage or over-current flow from a charger. The charger IC includes a charger IC for at least one of the wired charging and the wireless charging.

The wireless charging may be classified, for example, into a magnetic resonance type, a magnetic induction type, and an electromagnetic type. An additional circuit for the wireless charging, for example, a coil loop, a resonant circuit, a rectifier, and the like, may be added.

The battery gauge may measure a residual quantity of the battery 296 and a voltage, current, and temperature during charging. The battery 296 stores or generates electricity and supplies power to the electronic device 201 by using the stored or generated electricity. The battery 296 may include a rechargeable battery or a solar battery.

The indicator 297 indicates a specific state, such as a booting state, a message state, a charging state, and the like, of the electronic device 201 or a part thereof (e.g., the AP 210).

The motor 298 converts an electric signal into a mechanical vibration.

The electronic device 201 includes a processing unit (e.g., a GPU) for supporting mobile TV. The processing unit for supporting mobile TV processes media data according to a protocol of, for example, digital multimedia broadcasting (DMB), digital video broadcasting (DVB), media flow, and the like.

Each of the aforementioned elements of the electronic device 201 may consist of one or more components, and names thereof may vary depending on a type of the electronic device 201. The electronic device 201 may include at least one of the aforementioned elements. Some of the elements may be omitted, or additional other elements may be further included. In addition, some of the elements of the electronic device 201 may be combined and constructed as one entity, so as to equally perform functions of corresponding elements before combination.

At least some parts of a device (e.g., modules or functions thereof) or method (e.g., operations) may be implemented with an instruction stored in a computer-readable storage media for example. The instruction may be executed by the processor 210, to perform a function corresponding to the instruction. The computer-readable storage media may be the memory 230. At least some parts of the programming module may be implemented (e.g., executed) by the processor 210. At least some parts of the programming module may include modules, programs, routines, a set of instructions, processes, and the like, for performing one or more functions.

Figure 3:
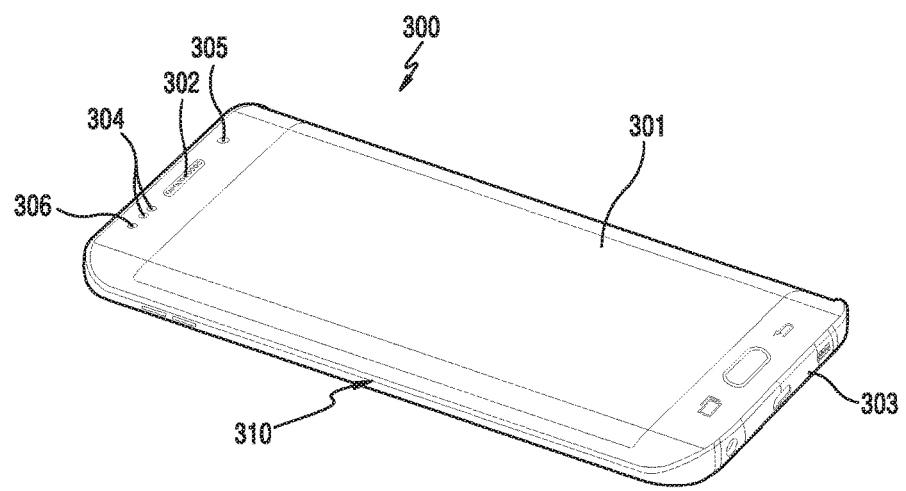
FIG. 3 illustrates a perspective view of an electronic device according to various embodiments of the present disclosure.

FIG. 3 illustrates a perspective view of an electronic device 300 according to various embodiments of the present disclosure.

Referring to FIG. 3, a display 301 may be disposed on the front face of the electronic device 300. According to one embodiment, a speaker device 302 may be disposed at one side of the display 301 so as to receive the voice of a counterpart. According to one embodiment, a microphone device 303 may be disposed at the other side of the display 301 to transmit the voice of a user to the counterpart.

According to various embodiments, components for conducting various functions of the electronic device 300 may be arranged around the speaker device 302. The components may include one or more sensor modules 304. The sensor modules 304 may include at least one of, for example, an illuminance sensor (e.g., an optical sensor), a proximity sensor (e.g., an optical sensor), an infrared sensor, and an ultrasonic sensor. According to one embodiment, the components may include a front camera device 305. According to one embodiment, the components may include an indicator 306 configured to allow a user to recognize status information of the electronic device.

According to various embodiments, the electronic device 300 may include a metallic member 310 as a housing. According to one embodiment, the metallic member 310 may be arranged along the rim of the electronic device 300, and may be disposed to expand to at least a partial region of the rear face of the electronic device 300 that extends from the rim. According to one embodiment, the metallic member 310 defines at least a portion of the thickness of the electronic device 300 along the rim of the electronic device 300, and may be formed in a closed loop shape. Without being limited thereto, however, the metallic member 310 may be formed to serve as at least a portion of the thickness of the electronic device. In addition, the metallic member 310 may be at least partially embedded in the inside of the electronic device 300.

According to various embodiments, the electronic device 300 may include a plurality of electronic components therein. According to one embodiment, the electronic components may include one or more of an antenna device, a battery pack, a board (e.g., a Printed Circuit Board (PCB) or a Flexible Printed Circuit Board (FPCB)), a wireless charging battery cover, a socket device, a shield can, various devices, a sensor module, a camera module, a speaker module, a microphone module, a key button assembly, an interface connector, at least a partial region of the housing, and a lighting device.

According to various embodiments, the above-mentioned electronic components may be disposed to be spaced from each other, but may be electrically connected to each other. For example, certain electronic components may be spaced apart from each other, but need to be electrically connected to each other (e.g., connected for grounding). In such a case, an electric connection device may be interposed between each two electronic components.

According to various embodiments, the electric connection device may be physically in multiple contact with at least two portions of electronic components so as to conduct a stable operation by securing a sufficient contact amount.

Figure 4:
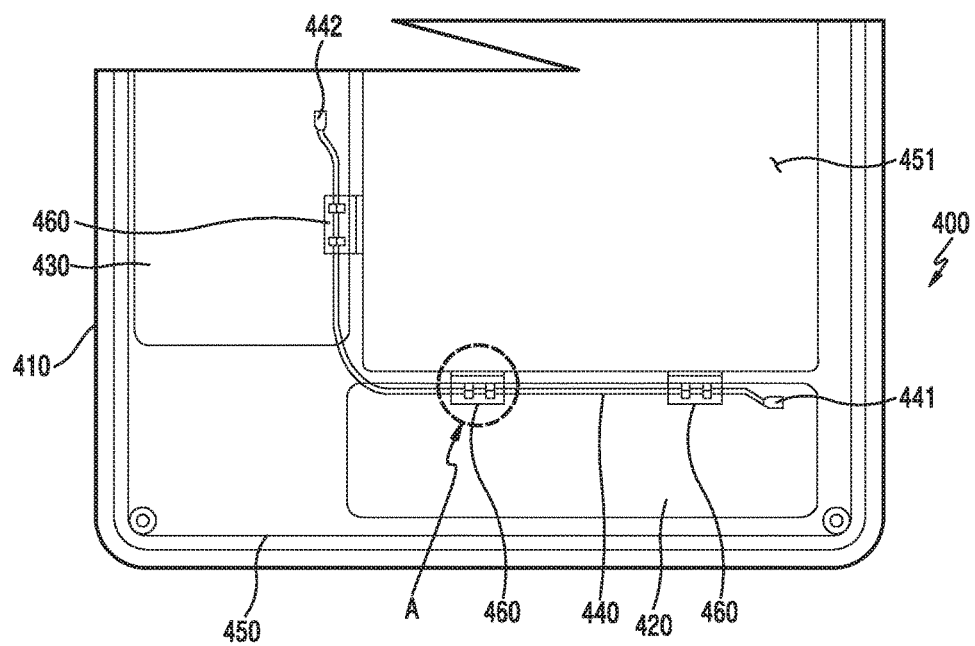
FIG. 4 illustrates a configuration of a principal portion of an electronic device that includes an electric connection device according to various embodiments of the present disclosure.

FIG. 4 illustrates a configuration of a principal portion of an electronic device that includes an electric connection device 460 according to various embodiments of the present disclosure. The electronic device 400 of FIG. 4 may be an embodiment of an electronic device that is similar to or different from the electronic device 300 of FIG. 3.

Referring to FIG. 4, the electronic device 400 may include the housing 410. According to one embodiment, at least a partial region of the housing 410 may be formed of a metallic member. According to one embodiment, a plurality of electronic components may be disposed in an inner space of the housing 410. According to one embodiment, the electronic components may include a metal-made bracket 450 disposed inside the housing 410. According to one embodiment, the electronic components may include one or more boards 420 and 430 disposed inside the housing 410. According to one embodiment, boards 420 and 430 may include a hard type PCB. According to one embodiment, the boards 420 and 430 may include a Flexible PCB (FPCB).

According to various embodiments, as illustrated, one or more of the boards 420 and 430 may be electrically connected with the bracket 450 made of a metallic material by an electric connection device 460. According to one embodiment, the bracket 450 may further include a space for mounting a component or a cutout and hole region 451 for securing a margin space provided in consideration of a change in a component (e.g., swelling of a battery pack) caused during use. According to one embodiment, the electric connection device 460 may be installed in an area around the hole region ("A" area) and may also serve to support a side face of the mounted battery pack. Although not illustrated, the electric connection device 460 may electrically connect the housing 410 made of a metallic member to the board.

According to various embodiments, the electric connection device 460 may include a cable clamp for a function of fixing a cable, in addition to the function of electrically connecting two electronic components. According to one embodiment, the cable clamp provided in the electric connection device 460 may restrain at least a partial region of a cable 440 (e.g., a coaxial cable) having a length that is equal to or larger than a predetermined length in order to prevent the cable 440 from floating in the electronic device 400. For example, as illustrated, the cable 440 having connectors 441 at opposite ends thereof may be used in order to electrically connect a first board 420 and a second board 430. In such a case, the cable 440 is restrained in position by a pair of electric connection devices 460 mounted on the first board 420 and an electric connection device 460 mounted on the second board 430.

According to various embodiments, the cable 440 may be an RF cable. According to one embodiment, the cable clamp may be electrically connected to an RF cable ground (GND). According to one embodiment, when the cable 440 is fixed to the electric connection device 460, the electric connection devices 460 may share the GND with the RF cable through the cable clamp.

Figure 5A:
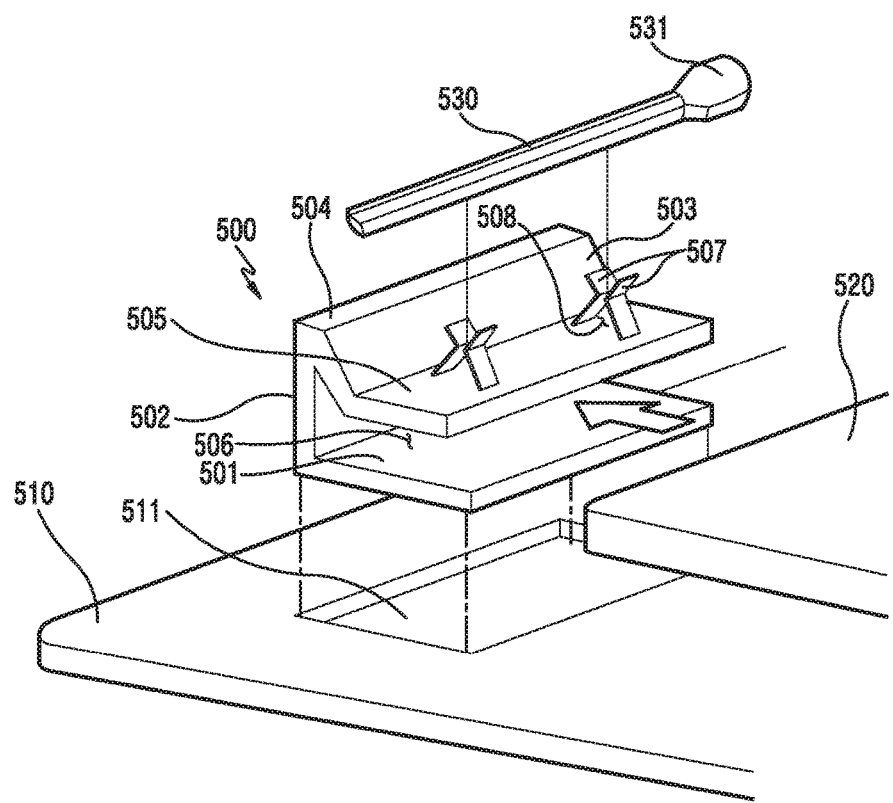
FIG. 5A illustrates a state of an electronic device in which two electronic components are being connected by an electric connection device according to various embodiments of the present disclosure.
Figure 5B:
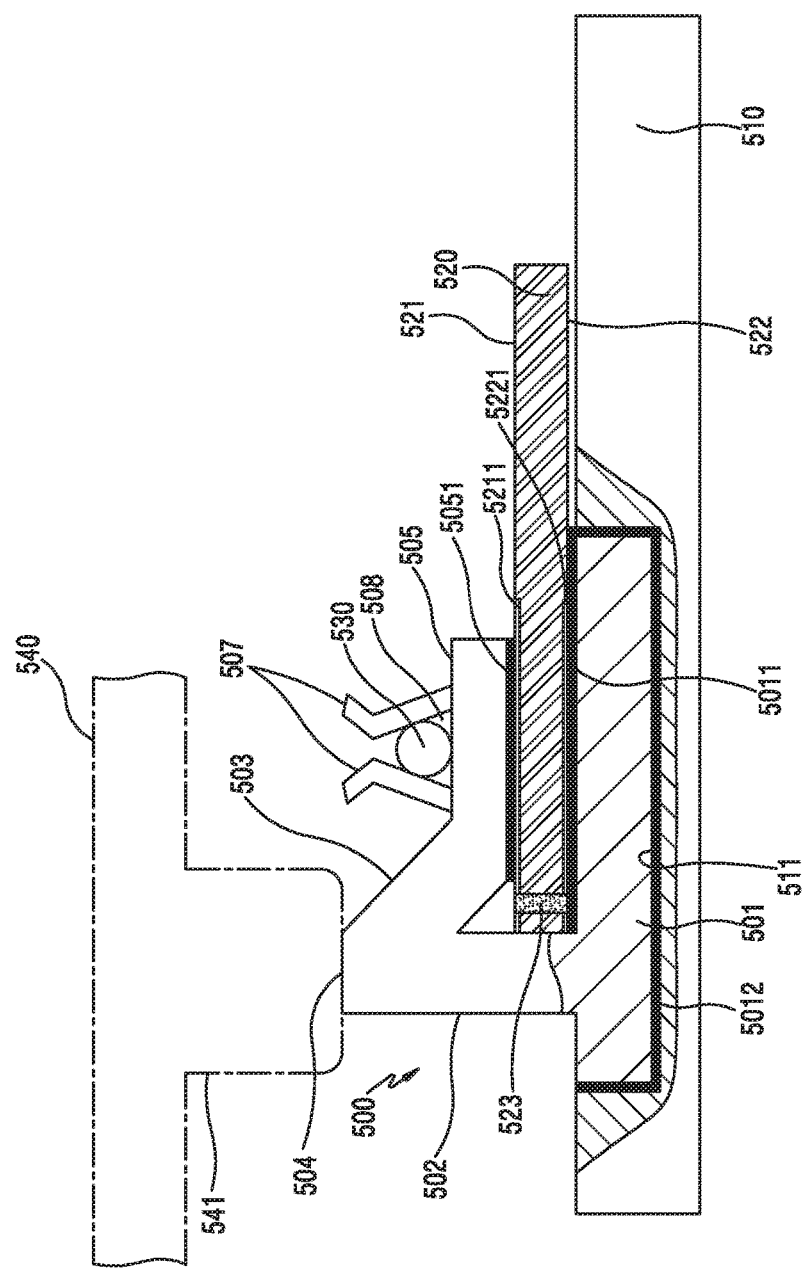
FIG. 5B illustrates a sectional view of a principal portion of an electronic device in a state in which two electronic components of "A" portion in FIG. 4 are electrically connected by the electric connection device according to various embodiments of the present disclosure.

FIG. 5A illustrates a state of an electronic device in which two electronic components are being connected by an electric connection device 500 according to various embodiments of the present disclosure. FIG. 5B illustrates a sectional view of a principal portion of an electronic device in a state in which two electronic components of the "A" portion in FIG. 4 are electrically connected by the electric connection device according to various embodiments of the present disclosure.

The electric connection device 500 of FIGS. 5A and 5B may be an embodiment of an electric connection device that is similar to or different from the electric connection device 460 of FIG. 4.

Referring to FIG. 5A, the electronic device may include a first electronic component 510 and a second electronic component 520. According to one embodiment, the first electronic component 510 and the second electronic component 520 may be electrically connected to each other via the electric connection device 500. According to one embodiment, the first electronic component 510 may include a bracket that is made of a metallic material and is disposed inside the electronic device. According to one embodiment, the second electronic component 520 may be a board that is disposed inside the electronic device. According to one embodiment, the board may include a PCB. According to one embodiment, the electric connection device 500 may be used in order to ground the bracket that is made of a metallic material to the board.

According to various embodiments, the electric connection device 500 may include a first member 501 fixed to the first electronic component 510, a second member 502 extending upwardly by a predetermined length from the first member 501, a third member 503 having a predetermined inclination with respect to the second member 502 and extending toward the first member 501, and a fourth member 505 extending from the third member 503 to be substantially parallel to the first member 501. According to one embodiment, the first to fourth members 501, 502, 503, and 505 may be integrally formed with each other. According to one embodiment, the electric connection device 500 formed by the first to fourth members 501, 502, 503, and 505 may be formed in various shapes in which the board corresponding to second electronic component 520 may be interposed in a space between the first member 501 and the fourth member 505. According to one embodiment, the first member 501 and the fourth member 505 may be formed to be spaced apart from each other, and may include a component accommodation space 506 therebetween to accommodate at least a portion of the second electronic component 520. According to one embodiment, the electric connection device 500 may be formed of a metallic material (e.g., SUS, copper, or silver).

According to various embodiments, the electric connection device 500 may include one or more cable clamps 507. According to one embodiment, the cable clamps 507 may have a cable accommodation space 508, and may be disposed on the outer surface of the fourth member 505 to be spaced apart from each other. Without being limited thereto, however, the cable clamps 507 may be disposed on the outer surface of the second member 502 or the third member 503. According to one embodiment, the cable clamps 507 may be integrally formed with the fourth member 505, or may be fixed to the fourth member 505 as a separate member. According to one embodiment, the cable 530 may include a connector 531 to be electrically connected to the first electronic component 510 or the second electronic component 520.

According to various embodiments, the first electronic component 510 may include a recess 511 to accommodate at least a portion of the electric connection device 500. According to one embodiment, the recess 511 may be formed to have a depth that is capable of accommodating at least a portion of the first member 501 of the electric connection device 500.

According to various embodiments, the first electronic component 510 may include a bracket that is made of a metallic material. According to one embodiment, the second electronic component 520 may include a board (e.g., a PCB). According to one embodiment, the electric connection device 500 may be disposed in such a manner that the bracket is grounded to a ground portion of the board.

Referring to FIG. 5B, the first member 501 of the electric connection device 500 may be seated in the recess 511 formed on the first electronic component 510. According to one embodiment, the first member 501 may be fixed to the recess 511 using an adhesive member 5012. According to one embodiment, the adhesive member 5012 may be attached to the whole or a partial region of the recess 511. According to one embodiment, the adhesive member 5012 may include a material for conductive bonding (e.g., UV bonding or a silver paste) or a conductive tape. According to one embodiment, the first member 501 may be fixed in such a manner that the top face of the first member 501 is flush with the top face of the first electronic component 510, but is not limited thereto. For example, the top surface of the first member 501 may be fixed to be higher or lower than the top surface of the first electronic component 510.

According to one embodiment, at least a portion of the second electronic component 520 may be fixed in the component accommodation space 506 that is formed by the first member 501 and the fourth member 505 in such a manner that the portion of the second electronic component 520 is inserted into the component accommodation space 506. According to one embodiment, a region of the second electronic component 520 inserted into the component accommodation space 506 may include conductive exposure portions 5211 and 5221 to be electrically connected with the first member 501 and the fourth member 505. According to one embodiment, a first conductive exposure portion 5211 formed on the first face 521 of the second electronic component 520 may come in close contact with the fourth member 505 to be electrically connected with the fourth member 505. According to one embodiment, a second conductive exposure portion 5221 formed on the second face 522 of the second electronic component 520 may come in close contact with the first member 501 to be electrically connected with the first member 501. The second electronic component 520 may be fixed to the component accommodation space 506 by the first and fourth members 501 and 505 and adhesive members 5011 and 5051. According to one embodiment, the adhesive members 5011 and 5051 may include a material for conductive bonding (e.g., UV bonding or a silver paste) or a conductive tape. According to one embodiment, the second electronic component 520 having a thickness to be accommodated in the component accommodation space 506 of the electric connection device 500 may include at least one conductive via 523 formed from the first conductive exposure portion 5211 to the second conductive exposure portion 5221. According to one embodiment, by interconnecting the first and second conductive exposure portions 5211 and 5221 of the second electronic component 520 through the conductive via 523, the electric connection device 500 may electrically connect the first and second electronic components 510 and 520 with a greater contact amount. According to one embodiment, the second electronic component 520 may be a PCB, and the first and second conductive exposure portions 5211 and 5221 may include an electric conductive layer on which a Solder Resist (SR) layer is removed from the outer surface of the PCB.

According to various embodiments, the electric connection device 500 may include a cable clamp 507 for fixing a cable (e.g., a coaxial cable) 530. According to one embodiment, the cable clamp 507 may be disposed on the top face of the fourth member 505. According to one embodiment, the cable clamp 507 may include a pair of elastic members having a gap therebetween, which is narrowed at a central area. When the cable 530 is accommodated in a cable accommodation space 508, the narrowed gap portion may prevent the cable 530 from breaking away from the cable clamp 507. According to one embodiment, the cable clamp 507 is disposed on the fourth member 505 of the electric connection device 500, but is not limited thereto. For example, the cable clamps 507 may be disposed on the outer surface of the second member 502 and/or the outer surface of the third member 503. According to one member, the cable may include an RF cable. According to one embodiment, when the RF cable is fixed to the cable clamp disposed on an electric connection device that is reinforced in terms of grounding, an RF performance may be improved, and excellent noise shielding performance may be implemented.

According to various embodiments, a metallic member contact face 504 formed in a flat face that faces upward may be disposed between the second member 502 and the fourth member 505. In such a case, the metallic member contact face 504 may come in close contact with a contact portion (e.g., a bushing or a contact protrusion) 541 of the metallic member 540 disposed thereon. According to one embodiment, the electric connection device 500 may electrically connect the first electronic component 510, the second electronic component 520, and the metallic member 540 to each other. According to one embodiment, the metallic member 540 may be a housing that includes a metal disposed in at least a partial region of the electronic device.

According to various embodiments, the cable 530 may be an RF cable. According to one embodiment, the cable clamp 507 may be electrically connected to an RF cable GND. According to one embodiment, when the cable 530 is fixed to the electric connection device 500, the electric connection devices 500 may share the GND with the RF cable through the cable clamp 507.

Figure 6:
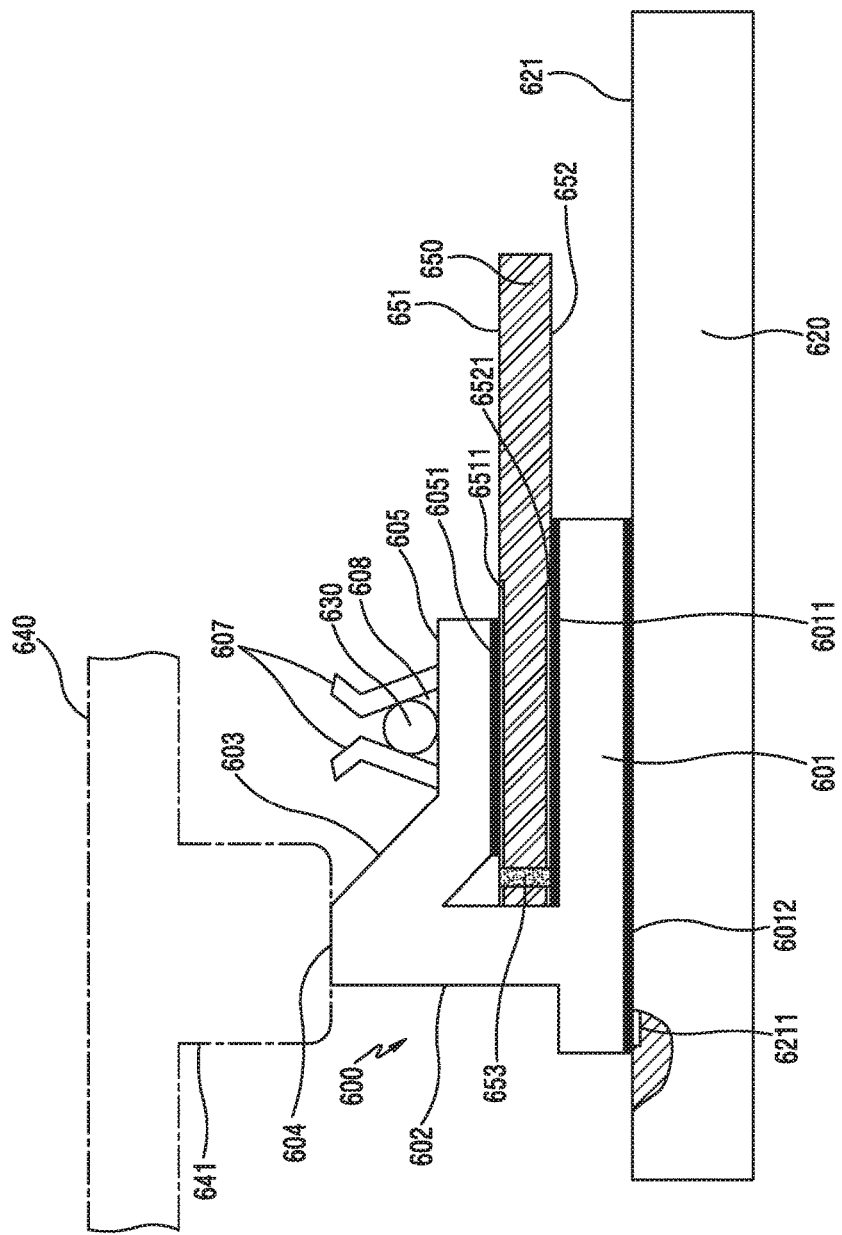
FIG. 6 illustrates a sectional view of a principal portion of an electronic device in a state in which two electronic components are electrically connected by an electric connection device according to various embodiments of the present disclosure.

FIG. 6 illustrates a sectional view of a principal portion of an electronic device in a state in which two electronic components are electrically connected by an electric connection device according to various embodiments of the present disclosure.

The electric connection device 600 of FIG. 6 may be another embodiment of an electric connection device that is similar to or different from the electric connection device 460 of FIGS. 4, 5A, and 5B.

Referring to FIG. 6, a first member 601 of the electric connection device 600 may be seated on the top surface 621 of a first electronic component 620. According to one embodiment, the first member 601 may be fixed to the top face 621 of the first electronic component 620 using an adhesive member 6012. According to one embodiment, the adhesive member 6012 may include a material for conductive bonding (e.g., UV bonding or a silver paste) or a conductive tape.

According to various embodiments, at least a portion of a second electronic component 650 may be fixed to a component accommodation space that is formed by the first member 601 and the fourth member 605 in such a manner that the portion of the second electronic component 650 is inserted into the component accommodation space. According to one embodiment, a region of the second electronic component 650 inserted into the component accommodation space may include conductive exposure portions 6511 and 6521 to be electrically connected with the first member 601 and the fourth member 605. According to one embodiment, a first conductive exposure portion 6511 formed on the first face 651 of the second electronic component 650 may come in close contact with the fourth member 605 to be electrically connected with the fourth member 505. According to one embodiment, a second conductive exposure portion 6521 formed on the second face 652 of the second electronic component 650 may come in close contact with the first member 601 to be electrically connected with the first member 501. The second electronic component 650 may be fixed to the component accommodation space by the first and fourth members 601 and 605 and adhesive members 6011 and 6051. According to one embodiment, the adhesive members 6011 and 6051 may include a material for conductive bonding (e.g., UV bonding or a silver paste) or a conductive tape. According to one embodiment, the second electronic component 650 having a thickness to be accommodated in the component accommodation space of the electric connection device 600 may include at least one conductive via 653 formed from the first conductive exposure portion 6511 to the second conductive exposure portion 6521. According to one embodiment, by interconnecting the first and second conductive exposure portions 6511 and 6521 of the second electronic component 650 through the conductive via 653, the electric connection device 600 may be electrically connect the first and second electronic components 620 and 650. According to one embodiment, the first electronic component 620 may include a PCB. According to one embodiment, the second electronic component 650 may an FPCB, and the first and second conductive exposure portions 6511 and 6521 may include an electric conductive layer on which an SR layer is removed from the outer surface of the FPCB.

According to various embodiments, the electric connection device 600 may include a cable clamp 607 for fixing a cable (e.g., a coaxial cable) 630. According to one embodiment, the cable clamp 607 may be disposed on the top face of the fourth member 605. According to one embodiment, the cable clamp 607 may include a pair of elastic members having a gap therebetween, which is narrowed at a central area. When the cable 630 is accommodated in a cable accommodation space 608, the narrowed gap portion may prevent the cable 630 from breaking away from the cable clamp 607. According to one embodiment, the cable clamp 607 is disposed on the fourth member 605 of the electric connection device 600, but is not limited thereto. For example, the cable clamps 607 may be disposed on at least a partial region of the second member 602 and/or at least a partial region of the third member 603.

According to various embodiments, a metallic member contact face 604 formed in a flat face that faces upward may be disposed between the second member 602 and the fourth member 605. In such a case, the metallic member contact face 604 may come in close contact with a contact portion (e.g., a bushing or a contact protrusion) 641 of the metallic member 640 disposed thereon. According to one embodiment, the electric connection device 600 may electrically connect the first electronic component 620, the second electronic component 650, and the metallic member 640 to each other. According to one embodiment, the metallic member 640 may be a housing that includes a metal disposed in at least a partial region of the electronic device.

According to various embodiments, the cable 630 may be an RF cable. According to one embodiment, the cable clamp 607 may be electrically connected to an RF cable GND. According to one embodiment, when the cable 630 is fixed to the electric connection device 600, the electric connection devices 600 may share the GND with the RF cable through the cable clamp 607.

Figure 7A:
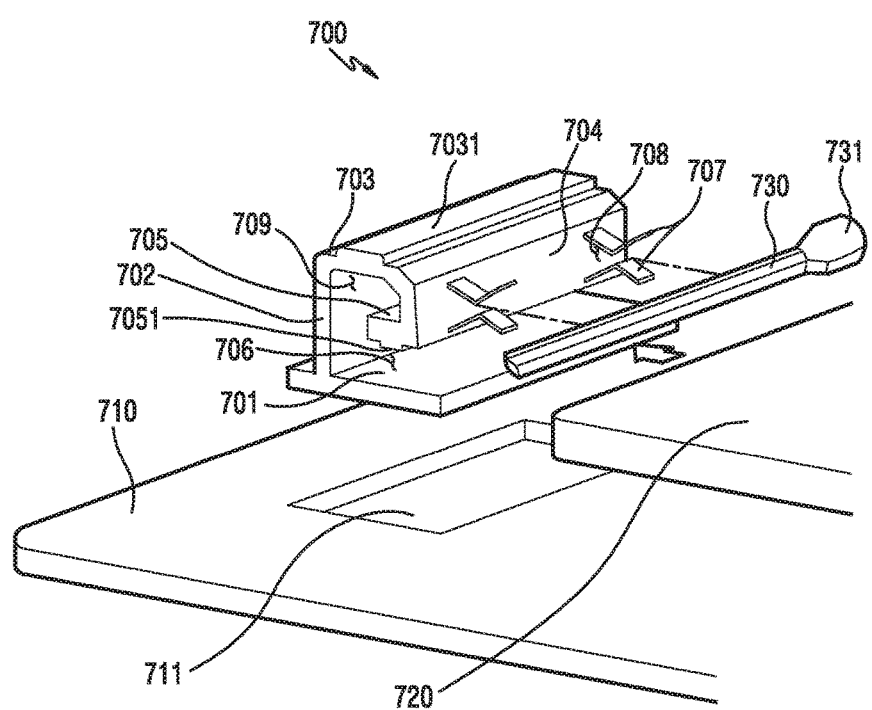
FIG. 7A illustrates a state of an electronic device in which two electronic components are being connected by an electric connection device according to various embodiments of the present disclosure.
Figure 7B:
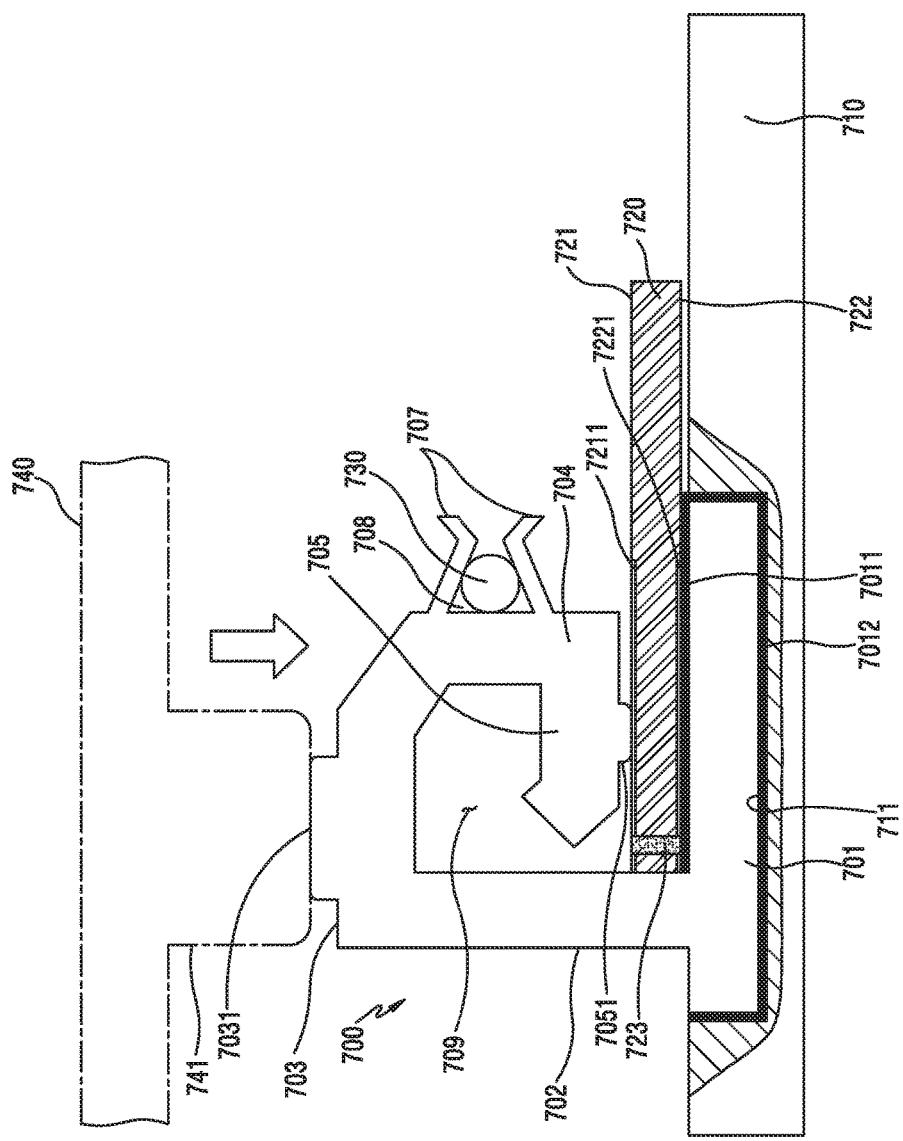
FIG. 7B illustrates a sectional view of a principal portion of an electronic device in a state in which two electronic components of FIG. 5A are electrically connected by the electric connection device according to various embodiments of the present disclosure.

FIG. 7A illustrates a state of an electronic device in which two electronic components are being electrically connected by an electric connection device according to various embodiments of the present disclosure. FIG. 7B illustrates a sectional view of a principal portion of an electronic device in a state in which two electronic components of FIG. 7A are electrically connected by the electric connection device 700 according to various embodiments of the present disclosure.

The electric connection device 700 of FIGS. 7A and 7B may be an embodiment of an electric connection device that is similar to or different from the electric connection devices 460, 500, and 600 of FIGS. 4 to 6.

Referring to FIG. 7A, the electronic device may include a first electronic component 710 and a second electronic component 720. According to one embodiment, the first electronic component 710 and the second electronic component 720 may be electrically connected to each other via the electric connection device 700. According to one embodiment, the first electronic component 710 may include a bracket that is made of a metallic material and is disposed inside the electronic device. According to one embodiment, the second electronic component 720 may be a board that is disposed inside the electronic device. According to one embodiment, the board may include a PCB. According to one embodiment, the electric connection device 700 may be used in order to ground the bracket that is made of a metallic material to the board.

According to various embodiments, the electric connection device 700 may include a first member 701 fixed to the first electronic component 710, a second member 702 extending upwardly by a predetermined length from the first member 701, a third member 703 extending from the second member 702 in a direction that is substantially parallel to the first member 701, a fourth member 704 extending from the third member 703 in a direction that is substantially parallel to the second member 702, and a fifth member 705 extending from the fourth member 704 toward the second member 702 to be substantially parallel to the third member 703. According to one embodiment, the first to fifth members 701, 702, 703, 704, and 705 may be integrally formed with each other. According to one embodiment, the first member 701 and the fifth member 705 may be formed to be spaced apart from each other, and may include a component accommodation space 706 therebetween to accommodate at least a portion of the second electronic component 720. According to one embodiment, the fifth member 705 may include a component contact face configured to come in contact with the second electronic component. According to one embodiment, the third member 703 of the electric connection device 700 may be formed to have a repulsive elastic force against a force to compress from the upper side to the lower side by an inner space 709 formed to be bent by the second to fifth members 702, 703, 704, and 705. According to one embodiment, the electric connection device 700 may be formed of a metallic material (e.g., SUS, copper, or silver).

According to various embodiments, the electric connection device 700 may include one or more cable clamps 707. According to one embodiment, the cable clamps 707 may have a cable accommodation space 708, and may be disposed on the outer surface of the fourth member 704 and spaced apart from each other. Without being limited thereto, however, the cable clamps 707 may be disposed on the outer surface of the second member 702 or the third member 703. According to one embodiment, the cable clamps 707 may be integrally formed with the fourth member 704, or may be fixed to the fourth member 704 as a separate member. According to one embodiment, the cable 730 may include a connector 731 to be electrically connected to the first electronic component 710 or the second electronic component 720.

According to various embodiments, the first electronic component 710 may include a recess 711 to accommodate at least a portion of the electric connection device 700. According to one embodiment, the recess 711 may be formed to have a depth that is capable of accommodating at least a portion of the first member 701 of the electric connection device 700.

According to various embodiments, the first electronic component 710 may include a bracket that is made of a metallic material. According to one embodiment, the second electronic component 720 may include a board (e.g., a PCB). According to one embodiment, the electric connection device 700 may be disposed in such a manner that the bracket is grounded to a ground portion of the board.

Referring to FIG. 7B, the first member 701 of the electric connection device 700 may be seated in the recess 711 formed on the first electronic component 710. According to one embodiment, the first member 701 may be fixed to the recess 711 using an adhesive member 7012. According to one embodiment, the adhesive member 7012 may include a material for conductive bonding (e.g., UV bonding or a silver paste) or a conductive tape. According to one embodiment, the first member 701 may be fixed in such a manner that the top face of the first member 701 is flush with the top face of the first electronic component 710, but is not limited thereto. For example, the top surface of the first member 701 may be fixed to be higher or lower than the top surface of the first electronic component 710.

According to various embodiments, at least a portion of the second electronic component 720 may be fixed in the component accommodation space 706 that is formed by the first member 701 and the fifth member 705 in such a manner that the portion of the second electronic component 720 is inserted into the component accommodation space 706. According to one embodiment, a region of the second electronic component 720 inserted into the component accommodation space 706 may include conductive exposure portions 7211 and 7221 to be electrically connected with the first member 701 and the fifth member 705.

According to one embodiment, a first conductive exposure portion 7211 formed on the first face 721 of the second electronic component 720 may come in close contact with the component contact face 7051 of the fifth member 705 to be electrically connected with the component contact face 7051 of the fifth member 705. Without being limited thereto, however, the whole of the fifth member 705 may come in contact with the first conductive exposure portion 7211. According to one embodiment, a second conductive exposure portion 7221 formed on the second face 722 of the second electronic component 720 may come in close contact with the first member 701 to be electrically connected with the first member 701. The second conductive exposure portion 7221 of the second electronic component 720 may be fixed in the component accommodation space 706 by the first member 701 and an adhesive member 7011. According to one embodiment, the adhesive member 7011 may include a material for conductive bonding (e.g., UV bonding or a silver paste) or a conductive tape. According to one embodiment, the second electronic component 720 having a thickness to be accommodated in the component accommodation space 706 of the electric connection device 700 may include at least one conductive via 723 formed from the first conductive exposure portion 7211 to the second conductive exposure portion 7221. According to one embodiment, by interconnecting the first and second conductive exposure portions 7211 and 7221 of the second electronic component 720 through the conductive via 723, the electric connection device 700 may electrically connect the first and second electronic components 710 and 720. According to one embodiment, the second electronic component 720 may be a PCB, and the first and second conductive exposure portions 7211 and 7221 may include an electric conductive layer on which an SR layer is removed from the outer surface of the PCB.

According to various embodiments, the electric connection device 700 may include cable clamps 707 for fixing a cable (e.g., a coaxial cable) 730. According to one embodiment, the cable clamps 707 may be disposed on the top face of the fourth member 704. According to one embodiment, the cable clamps 707 may include a pair of elastic members having a gap therebetween which is narrowed at a central area. When the cable 730 is accommodated in a cable accommodation space 708, the narrowed gap portion may prevent the cable 730 from breaking away from the cable clamps 707. According to one embodiment, the cable clamp 707 is disposed on the fourth member 704 of the electric connection device 700, but is not limited thereto. For example, the cable clamps 707 may be disposed on the outer surface of the second member 703 and/or the outer surface of the third member 704.

According to various embodiments, a metallic member contact face 7031 formed in a flat face that faces upward may be disposed on the top face of the third member 703. In such a case, the metallic member contact face 7031 may come in close contact with a contact portion (e.g., a bushing or a contact protrusion) 741 of the metallic member 740 disposed thereon. According to one embodiment, the electric connection device 700 may electrically connect the first electronic component 710, the second electronic component 720, and the metallic member 740 to each other. According to one embodiment, the metallic member 740 may be a housing that includes a metal disposed in at least a partial region of the electronic device. According to one embodiment, when the metallic member 740 compresses the third member 703 from the upper side in a direction indicated by an arrow, the electric connection device 700 may transfer a compressive force applied thereby to the fifth member 705 so as to cause the fifth member 705 and the second electronic component 710 to be in closer contact with each other.

According to various embodiments, the cable 730 may be an RF cable. According to one embodiment, the cable clamp 707 may be electrically connected to an RF cable GND. According to one embodiment, when the cable 730 is fixed to the electric connection device 700, the electric connection devices 700 may share the GND with the RF cable through the cable clamp 707.

FIG. 8 illustrates a sectional view of a principal portion of an electronic device in a state in which two electronic components are electrically connected by an electric connection device according to various embodiments of the present disclosure.

The electric connection device 800 of FIG. 8 may be another embodiment of an electric connection device that is similar to or different from the electric connection devices 460, 500, 600, and 700 of FIGS. 4 to 7A.

Referring to FIG. 8, a first member 801 of the electric connection device 800 may be seated on the top surface 821 of a first electronic component 820. According to one embodiment, the first member 801 may be fixed to the top face 821 of the first electronic component 820 using an adhesive member 8012. According to one embodiment, the adhesive member 8012 may include a material for conductive bonding (e.g., UV bonding or a silver paste) or a conductive tape.

According to various embodiments, at least a portion of a second electronic component 850 may be fixed in a component accommodation space that is formed by the first member 801 and the fifth member 805, in such a manner that the portion of the second electronic component 850 is inserted into the component accommodation space. According to one embodiment, a region of the second electronic component 850 inserted into the component accommodation space may include conductive exposure portions 8511 and 8521 to be electrically connected with the first member 801 and the fifth member 805. According to one embodiment, a first conductive exposure portion 8511 formed on the first face 851 of the second electronic component 850 may come in close contact with the fifth member 805 to be electrically connected with the fifth member 805. According to one embodiment, a second conductive exposure portion 8521 formed on the second face 852 of the second electronic component 850 may come in close contact with the first member 801 to be electrically connected with the first member 801. According to one embodiment, a first conductive exposure portion 8511 of the second electronic component 850 may come in close contact with the component contact face 8051 of the fifth member 805 to be electrically connected with the component contact face 8051 of the fifth member 805. According to one embodiment, the second conductive exposure portion 8521 of the second electronic component 850 may be fixed to the first member 801 by the adhesive member 8011 in the component accommodation space. According to one embodiment, the adhesive member 8011 may include a material for conductive bonding (e.g., UV bonding or a silver paste) or a conductive tape. According to one embodiment, the second electronic component 850 having a thickness to be accommodated in the component accommodation space of the electric connection device 800 may include at least one conductive via 853 formed from the first conductive exposure portion 8511 to the second conductive exposure portion 8521. According to one embodiment, by interconnecting the first and second conductive exposure portions 8511 and 8521 of the second electronic component 850 through the conductive via 853, the electric connection device 800 may be electrically connect the first and second electronic components 820 and 850 with a greater contact amount. According to one embodiment, the first electronic component 820 may be a PCB. According to one embodiment, the second electronic component 850 may be an FPCB, and the first and second conductive exposure portions 8511 and 8521 may include an electric conductive layer on which an SR layer is removed from the outer surface of the FPCB.

According to various embodiments, the electric connection device 800 may include cable clamps 807 for fixing a cable (e.g., a coaxial cable) 830. According to one embodiment, the cable clamps 807 may be disposed on the top face of the fourth member 804. According to one embodiment, the cable clamp 807 may include a pair of elastic members having a gap therebetween, which is narrowed at a central area. When the cable 830 is accommodated in a cable accommodation space 808, the narrowed gap portion may prevent the cable 830 from breaking away from the cable clamp 807. According to one embodiment, the cable clamp 807 is disposed on the fourth member 804 of the electric connection device 800, but is not limited thereto. For example, the cable clamps 807 may be disposed on the outer surface of the second member 802 and/or the outer surface of the third member 803.

According to various embodiments, a metallic member contact face 8031 formed to protrude as a flat face that faces upward may be disposed on the third member 803. In such a case, the metallic member contact face 8031 may come in close contact with a contact portion (e.g., a bushing or a contact protrusion) 841 of the metallic member 840 disposed thereon. According to one embodiment, the electric connection device 800 may electrically connect the first electronic component 820, the second electronic component 850, and the metallic member 840 to each other. According to one embodiment, the metallic member 840 may be a housing that includes a metal disposed in at least a partial region of the electronic device.

According to various embodiments, when the metallic member 840 compresses the third member 803 from the upper side in a direction indicated by an arrow, the electric connection device 800 may transfer a compressive force applied thereby to the fifth member 805 so as to cause the fifth member 805 and the second electronic component 850 to be in closer contact with each other.

According to various embodiments, the cable 830 may be an RF cable. According to one embodiment, the cable clamp

807 may be electrically connected to an RF cable GND. According to one embodiment, when the cable 830 is fixed to the electric connection device 800, the electric connection devices 800 may share the GND with the RF cable through the cable clamp 807.

According to various embodiments, an electronic device includes an electric connection device having a structure to be in multiple contact with an electronic component such that it is possible to prevent the performance of the electronic device in advance from being deteriorated by securing a stable contact regardless of a change in external environment and/or an external shock.

According to various embodiments, an electronic device may include: a first electronic component; a second electronic component electrically connected to the first electronic component; and a conductive electric connection device disposed to electrically connect the second component and the first electronic component to each other. The electric connection device may include: a first member fixed to the first electronic component; a second member formed to extend upward from the first member; and a third member formed to extend from the second member to be substantially parallel to a direction of overlapping with the first member. The second electronic component may be interposed in a space between the first member and the second member to be electrically connected to at least two areas of the second electronic component.

According to various embodiments, the first electronic component may include a metal member disposed in the electronic device.

According to various embodiments, the first electronic component may include a recess configured to seat the first member therein.

According to various embodiments, the first member may be fixed by a conductive adhesive member disposed in at least a partial region of the recess.

According to various embodiments, the conductive adhesive member may include a conductive bonding member or a conductive tape.

According to various embodiments, the second electronic component may include a board (a PCB or an FPCB) electrically connected to the first electronic component.

According to various embodiments, each of the first member and the second member comes in physical contact with a conductive exposure portion where an SR layer is removed from each of first and second faces of the board.

According to various embodiments, the board may include a via that is formed from the conductive exposure portion of the first face to the conductive exposure portion of the second face.

According to various embodiments, the board may be fixed to the first member and/or the second member by a conductive adhesive member.

According to various embodiments, the conductive adhesive member may include a conductive bonding member or a conductive tape.

According to various embodiments, the electric connection device may further include a fourth member that extends from the first member and is integrally connected with the third member, and the fourth member may be in contact with a third electronic component to be electrically connected to the third electronic component.

According to various embodiments, the third conductive member may include a metal housing of the electronic device.

According to various embodiments, the second member may be in compressive contact with the second electronic component by a compressive force of the metal housing.

According to various embodiments, the first electronic component and/or the second electronic component may include at least one of a Flexible Printed Circuit Board (FPCB), a PCB, and a metal housing.

According to various embodiments, the first member, the second member, and/or the third member may be provided with at least one cable clamp configured to restrain a cable.

According to various embodiments, the cable may be an RF cable, and when the RF cable is restrained through the cable clamp, the RF cable and the electric connection device may share a ground (GND).

According to various embodiments, the electric connection device may be used as a partition of a third electronic component disposed therearound.

According to various embodiments, the third electronic component may include a battery pack.

According to various embodiments, there may be provided an electric connection member including: a first member fixed to be electrically connected to a first electronic component; a second member formed to extend upward from the first member; and a third member formed to extend from the second member to be substantially parallel to a direction of overlapping with the first member. The second electronic component may be interposed in a space between the first member and the second member to be electrically connected to at least two areas of the second electronic component. According to various embodiments, there may also be provided an electronic device to which the electric connection device is applied.

According to various embodiments, the first electronic component may be at least one metallic member disposed inside the electronic device, and the second electronic component may include a board, to which the metallic member is grounded.

The embodiments of the present disclosure disclosed in the specification and the drawings are only particular examples proposed in order to easily describe the technical matters of the present disclosure and help with comprehension of the present disclosure, and do not limit the scope of the present disclosure. Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising: a first electronic component; a second electronic component electrically connected to the first electronic component; and a conductive member disposed to electrically connect the second electronic component and the first electronic component to each other, wherein the conductive member includes: a first member fixed to the first electronic component; a second member formed to extend upward from the first member; and a third member formed to extend from the second member in a direction of overlapping with the first member, wherein the first member or the third member is provided with a cable clamp configured to restrain a cable, and wherein the second electronic component is interposed in a space between the first member and the third member to be securely fixed to the conductive member such that the second electronic component is electrically connected to the first electronic component via at least two areas of the conductive member.

2. The electronic device of claim 1, wherein the first electronic component includes a metal member disposed in the electronic device.

3. The electronic device of claim 1, wherein the first electronic component includes a recess configured to seat the first member therein.

4. The electronic device of claim 3, wherein the first member is fixed by a conductive adhesive member disposed in at least a partial region of the recess.

5. The electronic device of claim 4, wherein the conductive adhesive member includes a conductive bonding member or a conductive tape.

6. The electronic device of claim 1, wherein the second electronic component includes a board (a PCB or an FPCB) electrically connected to the first electronic component.

7. The electronic device of claim 6, wherein each of the first member and the third member comes in physical contact with a conductive exposure portion where a Solder Resist (SR) layer is removed from each of first and second faces of the board.

8. The electronic device of claim 7, wherein the board includes a via formed on the conductive exposure portion of the first face to the conductive exposure portion of the second face such that the conductive exposure portions are electronically connected to each other.

9. The electronic device of claim 7, wherein a first conductive adhesive member is disposed between the board and the first member at the conductive exposure portion of the second face, and a second conductive adhesive member is disposed between the board and the third member at the conductive exposure portion of the first face.

10. The electronic device of claim 9, wherein the conductive adhesive members include a conductive bonding member or a conductive tape.

11. The electronic device of claim 1, wherein the conductive member further includes a fourth member that extends from the first member and is integrally connected with the third member, and the fourth member is in contact with a third electronic component to be electrically connected to the third electronic component.

12. The electronic device of claim 11, wherein the third electronic component includes a metal housing of the electronic device.

13. The electronic device of claim 12, wherein the third member is in compressive contact with the second electronic component by a compressive force of the metal housing.

14. The electronic device of claim 1, wherein the first electronic component or the second electronic component include at least one of a Flexible Printed Circuit Board (FPCB), a PCB, and a metal housing.

15. The electronic device of claim 1, wherein the cable is an RF cable, and when the RF cable is restrained through the cable clamp, the RF cable and the conductive member share a ground (GND).

16. The electronic device of claim 1, wherein the conductive member is used as a partition of a third electronic component disposed therearound.

17. The electronic device of claim 16, wherein the third electronic component includes a battery pack.

18. An electric device comprising: a housing comprising a first plate and a second plate faced away from the first plate; a metal member interposed between the first plate and the second plate; a printed circuit board; and a conductive member disposed to be electrically connected to the printed circuit board and the metal member, the conductive member comprising: a first member fixed to the metal member: a second member formed to extend upward from the first member; and a third member formed to extend from the second member to be substantially parallel with the first member, wherein the first member or the third member is provided with a cable clamp configured to restrain a cable, and wherein the printed circuit board is interposed in a space between the first member and the third member to be securely fixed to the conductive member such that the printed circuit board is electrically connected to the metal member via at least two areas of the conductive member.

19. The electric device of claim 18, further comprising a fourth member that extends from the first member and is integrally connected with the third member, wherein the fourth member is in contact with the first plate so as to be electrically connected to the first plate.

* * * * *